(12) United States Patent
Lyszus et al.

(10) Patent No.: US 9,941,078 B2
(45) Date of Patent: Apr. 10, 2018

(54) TOUCH AND/OR PROXIMITY-SENSITIVE ACTUATION ELEMENT AND DOMESTIC APPLIANCE HAVING AN ACTUATION ELEMENT

(71) Applicant: DIEHL AKO STIFTUNG & CO. KG, Wangen (DE)

(72) Inventors: Joachim Lyszus, Baindt (DE); Bruno Fuhge, Achberg (DE); Ralph Stohr, Leutkirch (DE); Andreas Maigler, Bad Waldsee (DJ); Thomas Frommelt, Munich (DE)

(73) Assignee: Diehl AKO Stiftung & Co. KG, Wangen (DE)

( * ) Notice: Subject to any disclaimer, the term of this patent is extended or adjusted under 35 U.S.C. 154(b) by 85 days.

(21) Appl. No.: 14/938,884

(22) Filed: Nov. 12, 2015

(65) Prior Publication Data
US 2016/0064167 A1 Mar. 3, 2016

Related U.S. Application Data

(63) Continuation of application No. PCT/EP2014/001260, filed on May 10, 2014.

(30) Foreign Application Priority Data

May 18, 2013 (DE) .................. 10 2013 008 702

(51) Int. Cl.
*H01H 19/14* (2006.01)
*H03K 17/96* (2006.01)
(Continued)

(52) U.S. Cl.
CPC ........... *H01H 19/14* (2013.01); *G06F 3/0362* (2013.01); *G06F 3/03547* (2013.01);
(Continued)

(58) Field of Classification Search
CPC ......... G06F 2203/04103; G06F 3/0202; G06F 3/0416; H01H 13/14; H01H 2239/006;
(Continued)

(56) References Cited

U.S. PATENT DOCUMENTS 7,564,247 B2 7/2009 Born et al.
8,683,992 B2 4/2014 Rauth et al.
(Continued)

FOREIGN PATENT DOCUMENTS

CN 1885718 A 12/2006
CN 102106085 A 6/2011
(Continued)

*Primary Examiner* — Ahmed Saeed
(74) *Attorney, Agent, or Firm* — Laurence A. Greenberg; Werner H. Stemer; Ralph E. Locher (57) ABSTRACT

A touch and/or proximity-sensitive actuation element has an electrically non-conductive housing, which has a fastening portion for the stationary and non-rotational mounting of the actuation element and a substantially cylindrical detection portion, which defines a touch and/or proximity-sensitive detection region of the actuation element, at which a rotary movement of a user around the actuation element can be detected. A plurality of electrically conductive sensor elements are arranged in the housing spaced apart from one another along a lateral surface of the detection portion. A printed circuit board is provided and has a plurality of contact faces, which are each electrically conductively in contact with one of the plurality of sensor elements.

11 Claims, 6 Drawing Sheets

(51) Int. Cl.
  *G06F 3/0354*   (2013.01)
  *G06F 3/0362*   (2013.01)
  *G06F 3/044*    (2006.01)

(52) U.S. Cl.
  CPC ......... *G06F 3/044* (2013.01); *H03K 17/9622* (2013.01); *H03K 2217/96066* (2013.01); *H03K 2217/960785* (2013.01)

(58) Field of Classification Search
  CPC .... H03K 17/962; H03K 17/96; H03K 17/955; H03K 17/9622; H03K 17/98
  USPC ............... 200/600, 512, 341, 314, 520, 530; 345/174, 173
  See application file for complete search history.

(56) References Cited

U.S. PATENT DOCUMENTS

2005/0098414 A1* 5/2005 Tsai ....................... H01H 13/85
                                                            200/5 R
2007/0181410 A1  8/2007 Baier
2010/0253653 A1  10/2010 Stambaugh et al.

FOREIGN PATENT DOCUMENTS

| DE | 202005019978 U1 | 5/2006 |
| DE | 202006019447 U1 | 3/2007 |
| WO | 2010115014 A1   | 10/2010 |

* cited by examiner

TOUCH AND/OR PROXIMITY-SENSITIVE ACTUATION ELEMENT AND DOMESTIC APPLIANCE HAVING AN ACTUATION ELEMENT

CROSS-REFERENCE TO RELATED APPLICATION

This is a continuation application, under 35 U.S.C. §120, of copending international application No. PCT/EP2014/001260, filed May 10, 2014, which designated the United States; this application also claims the priority, under 35 U.S.C. §119, of German patent application No. DE 10 2013 008 702.3, filed May 18, 2013; the prior applications are herewith incorporated by reference in their entirety.

BACKGROUND OF THE INVENTION

Field of the Invention

The present invention relates to a touch and/or proximity-sensitive actuation element, in particular an actuation element functioning by the capacitive operating principle, in particular a rotary actuation element, and in particular an actuation element for electronic domestic appliances.

Touch and/or proximity-sensitive actuation elements or push switches, which for example trigger a certain switching process and/or can change an appliance setting simply by being touched or merely by being approached by a user (or finger thereof), are often used in many electronic domestic appliances, such as ovens, stove tops (hobs), microwaves, dishwashers, washing machines, tumble dryers and the like.

In this context touch and/or proximity-sensitive actuation elements that operate in accordance with a capacitive, inductive, optical, thermal and/or piezoelectric operating principle are known in particular. In the case of a capacitive actuation element a sensor element formed from an electrically conductive material forms a capacitor together with, for example, a finger of a user via a cover plate formed from an electrically insulating material and acting as a dielectric, which capacitor is variable in accordance with the actuation of the actuation element, i.e. the touching on non-touching or the approaching or non-approaching of a detection region of the cover plate associated with the sensor element. A change to this capacitance value of the sensor element accordingly influences an output signal of the associated sensor circuit, which signal may be processed by an evaluation/control electronics unit and may be evaluated in order to detect an actuation of the capacitive actuation element where applicable.

Besides simple push switches, touch and/or proximity-sensitive slide controllers are also known. A combination of touch-sensitive slide controllers and touch-sensitive push switches is disclosed for example in German utility model DE 20 2006 019 447 U1.

Furthermore, international patent disclosure WO 2010/115014 A1, corresponding to U.S. patent publication No. 2010/02533653, discloses a "virtual" rotary knob, which sits detachably on the user side of an operator control panel and guides the movement of a finger of a user along a circular path. This movement of a finger of a user can be detected by capacitive sensor electrodes, which are arranged annularly on a circuit board on the side of the operator control panel facing away from the user.

SUMMARY OF THE INVENTION

The object of the present invention is to create an improved touch and/or proximity-sensitive actuation element in the form of a rotary knob.

The touch and/or proximity-sensitive actuation element of the invention has an electrically non-conductive housing, which has a fastening portion for the stationary and non-rotational mounting of the actuation element and a substantially cylindrical detection portion, which defines a touch and/or proximity-sensitive detection region of the actuation element, at which a rotary movement of a user around the actuation element can be detected. A plurality of electrically conductive sensor elements are provide, which are arranged in the housing spaced apart from one another along a lateral surface of the detection portion; and a printed circuit board, which has a plurality of contact faces, which are each electrically conductively in contact with one of the plurality of sensor elements.

The actuation element according to the invention provides the user with a body in the form of a rotary knob for operating, for example, an electronic domestic appliance. Here, the rotary knob itself cannot be moved, in particular cannot be rotated; instead a rotary or rotational movement for example of one or more fingers of a user's hand (touching the rotary knob or not) around this fixed rotary knob is detected by the capacitive sensor elements in the housing of the actuation element. In this way a "virtual" rotary knob is created, which contains no moving/rotating components and therefore is more reliable, is subject to less wear, and can be cleaned more easily than conventional rotary knobs.

Besides the capacitive sensor elements, the actuation element according to the invention also has a printed circuit board containing the associated contact faces. A compact construction of the actuation element and a simple mounting as a unit are thus possible.

The housing is preferably manufactured from an electrically non-conductive material, preferably a plastics material. The housing is preferably manufactured as a one-part or multi-part injection molded part. The fastening portion and the detection portion of the housing are preferably formed integrally with one another or are fixedly connected to one another.

The fastening portion of the housing serves for the stationary and non-rotational mounting of the actuation element. Here, the mounting is detachable or permanent. The fastening portion is preferably mounted by a bonded connection or a screwed connection. The fastening portion is preferably formed in the manner of a fastening flange.

The substantially cylindrical detection portion in this context has a substantially cylindrical shape with a base area and a circumferential lateral surface. Here, the base area is in principle formed arbitrarily, preferably substantially in a circular or (preferably regularly) polygonal manner. The lateral surface extends over a height, which optionally may be the same size as, greater than or smaller than the greatest extension (for example diagonal) of the base area. The lateral surface runs starting from the base area preferably substantially in a straight line or curved once or more in a convex or concave manner. In addition, the lateral surface runs starting from the base area preferably substantially perpendicularly, tapering conically, or widening conically. Furthermore, combinations of the designs specified here of the cylindrical shape of the detection portion are also conceivable.

A plurality of electrically conductive sensor elements is arranged in the housing of the actuation element. Two, three, four, six, eight, twelve or sixteen sensor elements are preferably provided, without the invention being limited to these specific numbers. The plurality of sensor elements is spaced apart from one another, such that they are electrically insulated from one another. Here, an air gap or a housing partition wall is preferably arranged between each of the individual sensor elements. The plurality of sensor elements is arranged in the housing, such that they are electrically insulated by the housing with respect to the surroundings of the housing or of the actuation element. The housing may thus form a dielectric of a capacitor formed by a sensor element and for example a finger of a user. The plurality of sensor elements are preferably formed substantially identically to one another, however different types, forms and/or sizes of sensor elements in an actuation element may also be used.

Here, the plurality of sensor elements is arranged along the lateral surface of the substantially cylindrical detection portion. The sensor elements each extend in this regard at least partially, preferably to an extent of at least 50% or more, over the height of the detection portion. In this context, the arrangement along the lateral surface is preferably to be understood to mean an arrangement in which the (for example geometric) centers of gravity of the sensor elements lie on a line running substantially parallel to the lateral surface. This means that the sensor elements themselves do not necessarily have to run parallel to this lateral surface, i.e., besides curved plates, flat plates in particular may also be used as sensor elements, for example. In addition, the plurality of sensor elements are preferably arranged along the entire lateral surface of the detection portion, but may also be provided optionally only along a portion thereof.

The more sensor elements that are provided and the larger is the portion of the lateral surface along which they are arranged, the higher is the attainable accuracy when detecting a rotary movement of a user around this actuation element.

The printed circuit board has a plurality of contact faces. The number of contact faces preferably corresponds to the number of capacitive sensor elements. Each of the plurality of sensor elements is preferably electrically conductively in contact with exactly one of this plurality of contact faces. A sensor element optionally may also be electrically conductively in contact with two or more contact faces. The sensor elements here are preferably electrically conductively in contact with the contact faces directly or indirectly (i.e. via electrically conductive contact elements).

The printed circuit board is part of the actuation element according to the invention. Here, the printed circuit board is preferably arranged within the housing or directly bordering the housing. The printed circuit board is preferably arranged directly bordering the fastening portion of the housing. The printed circuit board is also preferably arranged in such a way that it is positioned on a side, for example of an operator control panel, facing away from the user in the mounted state of the actuation element.

The operating principle of a touch and/or proximity-sensitive capacitive push switch is known in principle to a person skilled in the art. The "virtual" rotary knob of the invention is composed of a plurality of such touch and/or proximity-sensitive push switches, which are arranged along the lateral surface of the substantially cylindrical detection portion. By detecting and evaluating the changes over time of the capacitance values of a plurality of these push switches, preferably of all these push switches, a measure and a direction of a movement over a plurality of push switches can be determined, in the present case therefore an angle of rotation and/or direction of rotation of the rotary movement of the user.

In a preferred embodiment of the invention the housing is fastened to the printed circuit board in a non-rotational manner, and the plurality of contact faces are arranged on the printed circuit board substantially along a ring, wherein they each electrically conductively contact (at least) one of the plurality of sensor elements in the housing. The (detachable or permanent) fastening of the housing to the printed circuit board enables a compact structure of the entire actuation element. In addition, a unit can thus be created that is easily mounted. The housing is preferably fastened to the printed circuit board by latching, clipping, press fitting, screwing, adhesive bonding or the like.

The arrangement of the plurality of contact faces on the printed circuit board substantially along a ring corresponds to the arrangement of the plurality of sensor elements in the housing along the lateral surface of the substantially cylindrical detection portion. The basic shape of the ring is arbitrary in principle, but is preferably circular or (preferably regularly) polygonal. The (for example geometric) centers of gravity of the plurality of contact faces are preferably arranged on a line substantially coinciding with the line over which the (for example geometric) centers of gravity of the sensor elements lie. In addition, the plurality of contact faces are preferably arranged along the entire ring, but optionally may also be provided only along a portion of the ring. The shape and size of the individual contact faces preferably substantially match those of the cross sections of the sensor elements, but may also deviate therefrom.

In a preferred embodiment of the invention the plurality of electrically conductive sensor elements each have, on their side facing toward the printed circuit board, a resilient contact portion for electrically conductively contacting (at least) one of the plurality of contact faces of the printed circuit board. Due to the resilient contact portion, permanently secure electrical contact with a contact face on the printed circuit board can be ensured, and it is possible to compensate for manufacturing and mounting tolerances. The resilient contact portions of the sensor elements are preferably prestressed against the contact faces of the printed circuit board in the assembled state of the actuation element.

In a preferred embodiment of the invention the housing has an (end-face) electrically non-conductive cover facing toward the user for defining a further touch and/or proximity-sensitive detection region of the actuation element, in which the touch or approach of a user can be detected. At least one further electrically conductive sensor element is arranged in the housing on the side of the cover facing away from the user. The printed circuit board has at least one further contact face, which is electrically conductively in contact with the at least one further sensor element.

In this embodiment the touch and/or proximity-sensitive rotary knob of the invention additionally has at least one touch and/or proximity-sensitive push switch. This expands the operating possibilities for the user with just one actuation element. In addition, the operator control panel can be designed more simply, since fewer actuation elements have to be integrated.

The at least one further sensor element in this context preferably has one, two, three or four further sensor elements. The number of further contact faces on the printed circuit board preferably corresponds to the number of these further sensor elements. Here, the further sensor elements are electrically conductively in contact with the further contact faces directly or indirectly. The further sensor elements are electrically insulated from one another and also with respect to the sensor elements, preferably by partition walls of the electrically non-conductive housing, and the further contact faces are electrically insulated from one another and also from the contact faces.

The cover is preferably manufactured from an electrically non-conductive material, preferably a plastics material. The cover is preferably manufactured as a one-part or multi-part injection molded part. The cover and the detection portion of the housing are preferably formed integrally with one another or are fixedly connected to one another. The entire housing is preferably manufactured by a 2-component injection molding method, or the cover is adhesively bonded to the rest of the housing.

In this embodiment the at least one further electrically conductive sensor element is preferably an electrically conductive coating or printing of the cover. Alternatively, the at least one further electrically conductive sensor element is arranged in the housing at a distance from the cover.

In this embodiment at least one electrically conductive contact element is also arranged in the housing and electrically conductively connects the at least one further electrically conductive sensor element to the at least one further contact face.

This electrically conductive contact element is preferably arranged resiliently in the housing and/or is formed in an at least partially resilient manner. This contact element is preferably formed as a spring element formed from an electrically conductive material (preferably metal) and/or as an electrically conductive foam body. Due to the resilient arrangement and/or formation of the contact element, permanently secure electrical contact can be ensured with the further contact face on the printed circuit board, and it is possible to compensate for manufacturing and mounting tolerances.

In a further embodiment of the invention the housing has an end-face cover facing toward the user, which cover is at least partially permeable to light; and at least one indicating element is arranged in the housing.

In this embodiment the touch and/or proximity-sensitive rotary knob of the invention additionally has at least one indicating element. This facilitates the operation of the actuation element for the user, since information (for example adjustment possibilities, current set values, operating state, etc.) can be communicated to the user via the at least one indicating element. In addition an operating unit with this embodiment of the touch and/or proximity-sensitive rotary knob may be formed in a more compact and space-saving manner, since it is possible to dispense with additional indicating elements besides the rotary knob. In addition, the operator control panel may be configured more simply, since fewer elements have to be integrated.

In this context an indicating element is to be understood to mean any type of arrangement that is suitable for optically presenting information to the user. Suitable indicating elements in particular include simple lighting elements (for example light-emitting diodes or light-emitting diode groups), optical waveguides coupled with lighting elements, displays (for example LED, LCD, etc.) and the like. The at least one indicating element preferably has one, two, three or four indicating elements or a unit formed from two or more indicating elements.

The cover is preferably manufactured from an electrically non-conductive material, preferably a plastics material. The cover is preferably manufactured as a one-part or multi-part injection molded part. The cover and the detection portion of the housing are preferably formed integrally with one another or are fixedly connected to one another. The entire housing is preferably manufactured by a 2-component injection molding method, or the cover is adhesively bonded to the rest of the housing.

In this embodiment the at least one indicating element preferably has at least one fastening device, and the housing preferably has at least one retaining device for engaging with the at least one fastening device. The connection between the retaining device and fastening device is preferably established by latching, clipping, adhesive bonding, press fitting, screwing or the like.

In this embodiment the housing or retaining device thereof has at least one aperture for guiding through a connection line connected to the least one indicating element. The printed circuit board preferably also has at least one aperture for guiding through this connection line, such that the connection line can be connected to the printed circuit board on the side thereof facing away from the housing.

The embodiments of the touch and/or proximity-sensitive actuation element of the invention containing at least one additional touch and/or proximity-sensitive push switch and containing at least one additional indicating element may preferably also be combined with one another. In this case the at least one further electrically conductive sensor element is preferably at least partially permeable to light.

In yet a further preferred embodiment of the invention a control device is also provided, which is configured to evaluate the measurement signals at the plurality of contact faces and/or the at least one further contact face, and/or to control the at least one indicating element depending on an actuation of the actuation element. The control device is preferably arranged on the printed circuit board of the actuation element, but may also be provided separately and removed therefrom.

The control device is preferably configured to detect the capacitance values belonging to the individual sensor elements or further sensor elements and to detect the changes in the values substantially parallel to one another or sequentially. The control device is preferably configured to detect an angle of rotation and/or a direction of rotation of a rotary movement of a user around the actuation element on the basis of the capacitance values or capacitance value changes belonging to the sensor elements.

The above-described touch and/or proximity-sensitive actuation element of the invention preferably can be used in an electronic domestic appliance, such as an oven, a hob, a microwave, a dishwasher, a washing machine, a tumble dryer and the like. The touch and/or proximity-sensitive actuation element of the invention is preferably mounted here in a non-rotational manner on an operator control panel of the domestic appliance.

Other features which are considered as characteristic for the invention are set forth in the appended claims.

Although the invention is illustrated and described herein as embodied in a touch and/or proximity-sensitive actuation element, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DETAILED DESCRIPTION OF THE INVENTION

The present invention will be described hereinafter by way of example on the basis of a washing machine. However, the actuation element according to the invention can also be used accordingly in other electronic domestic appliances.

Figure 1:
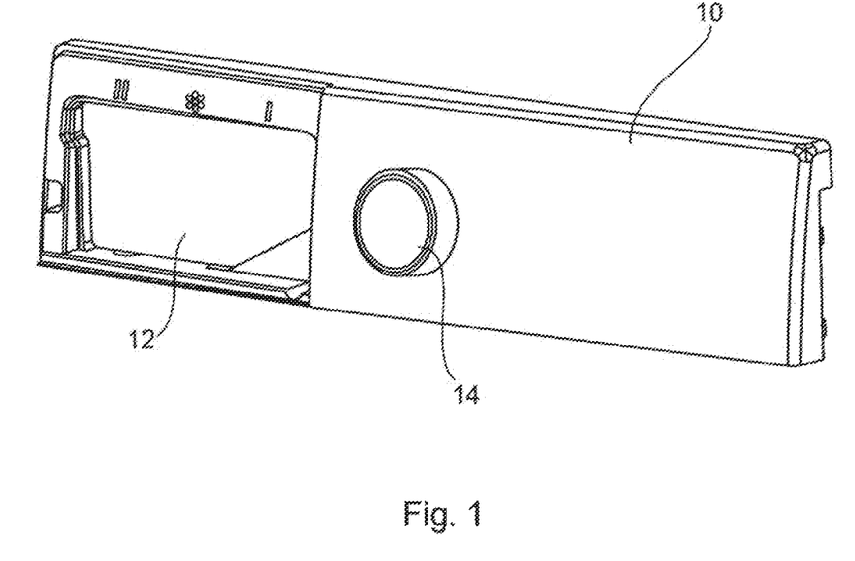
FIG. 1 is a diagrammatic, front perspective view (as viewed by a user) of an operator control panel of an electronic domestic appliance containing an actuation element according to the invention.

Referring now to the figures of the drawings in detail and first, particularly to FIG. 1 thereof, there is shown an operator control panel 10 of a washing machine manufactured for example from plastic or metal has an opening 12 for a drawer (having one or more compartments for washing detergent). In order to operate the washing machine, i.e. in particular in order to input a desired washing program (hot wash, color wash, gentle program, etc.) with desired parameters (washing temperature, spin speed, etc.) by a user, one or more actuation and indicating devices are provided on the operator control panel 10.

These actuation and indicating devices in accordance with the invention have at least one touch and/or proximity-sensitive actuation element 14 according to the invention and optionally further actuation and/or indicating elements. The actuation element configured in accordance with the invention is designed as a "virtual" rotary knob, which in this exemplary embodiment, in compact combination, has a first touch and/or proximity-sensitive detection region for detecting a rotary movement of a user around the actuation element, at least one second (further) touch and/or proximity-sensitive detection region for detecting a pushing movement of a user on the actuation element, and at least one indicating element for presenting information for the user.

The actuation element 14 is fastened (detachably or permanently) to the operator control panel 10 in a stationary and in particular also non-rotational manner. For example, the actuation element 14 is slid from a rear side of the operator control panel 10, facing away from the user, through an opening in order to protrude from the operator control panel 10 in the direction of the user (see FIG. 1), and for example is screwed or adhesively bonded to the rear side of the operator control panel 10.

The user may grasp around the actuation element 14 illustrated in FIG. 1 loosely or without contact, for example using a hand, and may perform with the hand a rotational movement around the actuation element, which is identified by the actuation element (with regard to angle of rotation and/or direction of rotation). Alternatively, the user may guide a finger loosely or without contact around the actuation element 14, which likewise is identified by the actuation element (with regard to angle of rotation and/or direction of rotation). This functionality of the actuation element forms the "virtual" (since the element itself cannot rotate) rotary knob having the aforementioned first touch and/or proximity-sensitive detection region. With the aid of this functionality the user for example may select menu items of an operating control, may select a washing program, and may select various control parameters and the like.

In addition, the user may touch or at least approach (for example with a finger) the end face facing toward said user. This functionality of the actuation element then forms the aforementioned second (further) touch and/or proximity-sensitive detection region. With the aid of this functionality the user for example may confirm a selection made by means of the first detection region ("OK" or "Enter" function). Optionally, two or more such second detection regions may also be provided on the end face in order to further expand the functionalities of the actuation element.

At least one indicating element is additionally visible for the user through the end face of the actuation element facing toward the user. With the aid of this at least one indicating element various pieces of information can be presented to the user, for example the menu navigation of the operating control, the selection possibilities for washing programs, the selection possibilities for the various control parameters, the current settings, the current operating state of the washing machine and the like. The at least one indicating element has simple color indications (for example by simple light-emitting diodes or optical waveguides coupled with light-emitting diodes) and/or displays (for example LED or LCD displays) in accordance with the information to be presented.

The structure and operating principle of such a "virtual" rotary knob will be explained in greater detail hereinafter on the basis of a preferred exemplary embodiment with reference to FIGS. 2 to 6.

Figure 2:
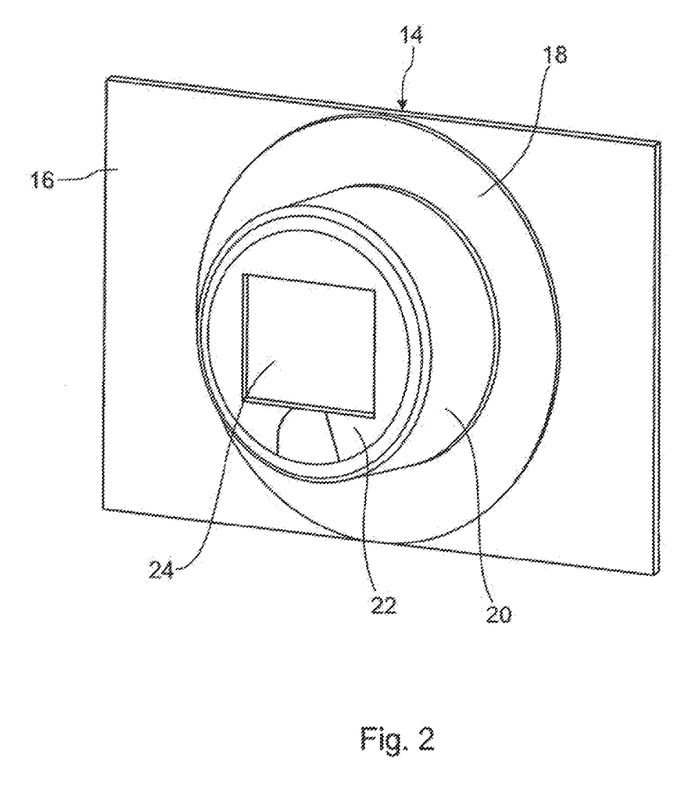
FIG. 2 is a perspective view from the front (as viewed by the user) of the actuation element in accordance with a preferred exemplary embodiment of the present invention.

As shown in FIG. 2, the actuation element 14 has a printed circuit board 16, which carries the sensor circuits and optionally also the evaluation electronics and the control device for the actuation element. The actuation element 14 is connected in a non-rotational manner to the printed circuit board 16 via a flange-shaped fastening portion 18. The fastening portion 18 serves simultaneously to fasten the actuation element 14 to the operator control panel 10 in a non-rotational manner.

In FIG. 2 the substantially cylindrical detection portion 20, which defines the first touch and/or proximity-sensitive detection region, the end-face cover 22, which defines the second touch and/or proximity-sensitive detection region, and a display as indicating element 24 can additionally be seen.

Figure 3:
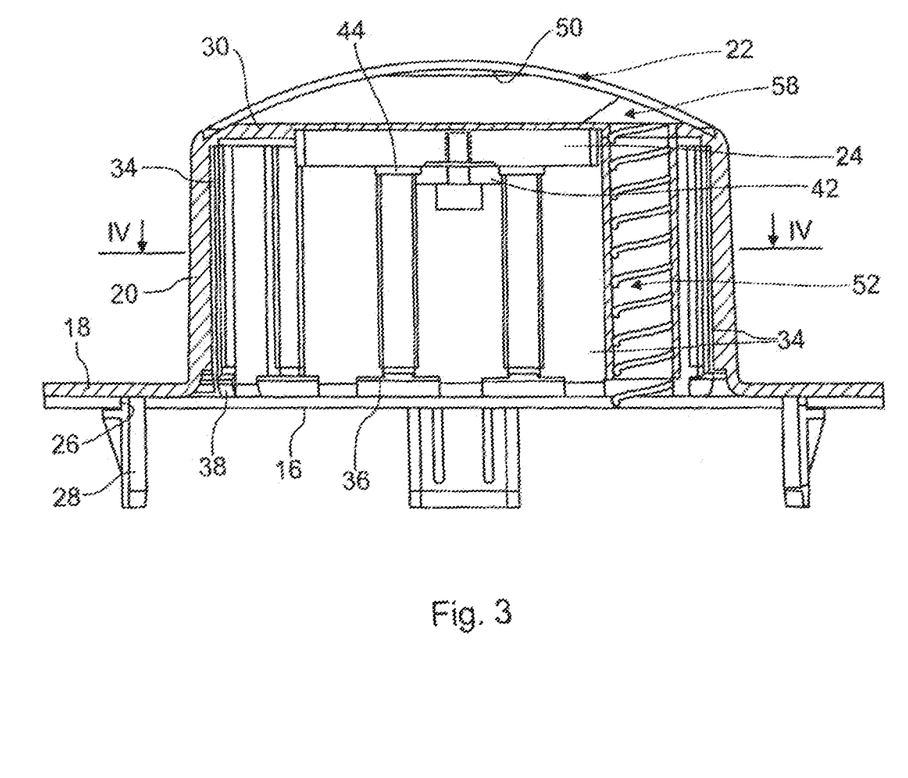
FIG. 3 is a side sectional view of the actuation element illustrated in FIG. 2.
Figure 5:
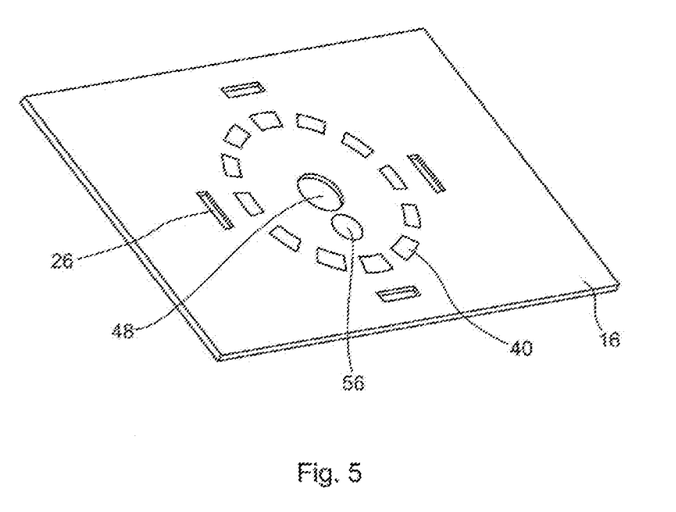
FIG. 5 is a perspective plan view of a printed circuit board of the actuation element of FIGS. 2 to 4 in accordance with an exemplary embodiment of the invention.

As illustrated in FIGS. 3 and 5, the printed circuit board 16 has a plurality of slot-shaped apertures 26, and the fastening portion 18 has a plurality of detent elements 28. The detent elements 28 are arranged and formed on the fastening portion 18 in such a way that they can be inserted through the apertures 26 in the printed circuit board 16 and can then be latched in order to fixedly connect the fastening portion 18 to the printed circuit board 16. The apertures 26 and detent elements 28 additionally ensure a correct orientation of the printed circuit board 16 relative to the other components of the actuation element 14. In the shown exemplary embodiment four apertures 26 and four detent elements 28 are provided, however fewer or more than four of these connection components may also be provided.

Figure 4:
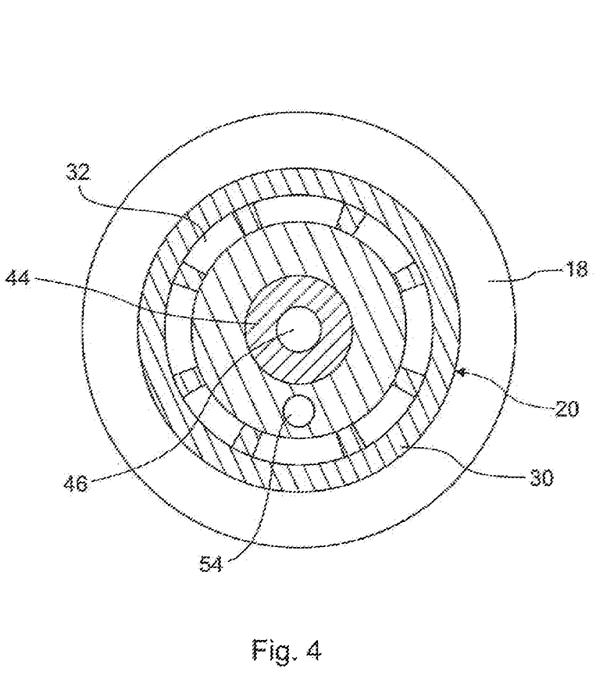
FIG. 4 is a cross-sectional view of the actuation element illustrated in FIG. 2 taken along the line IV-IV shown in FIG. 3.

As illustrated in FIGS. 3 and 4, the fastening portion 18 is part of a housing 30 formed from an electrically non-conductive plastics material. In particular, the substantially cylindrical detection portion 20 adjoins the flange-shaped fastening portion 18. The housing 30 with the portions 18, 20 is manufactured for example in one piece as an injection molded part.

The basic shape of the substantially cylindrical detection region 20 of the housing 30 is substantially circular in this exemplary embodiment (see FIG. 4). Alternatively, other basic shapes (for example polygonal, oval, etc.) are also possible. The basic shape of the flange-shaped fastening portion 18 is likewise substantially circular in this exemplary embodiment and is substantially coaxial with the detection portion 20. In other exemplary embodiments, however, the basic shape of the fastening portion 18 may also be formed independently of the detection portion 20.

The detection portion 20 additionally does not necessarily need to have a straight cylinder shape. As indicated in FIG. 3, the detection portion 20 may also taper conically in the direction away from the fastening portion 18. Alternatively, a conically widening design of the detection portion 20 is also possible. Furthermore, the lateral surface of the detection portion 20 may run substantially in a straight line in the direction away from the fastening portion 18 (direction from bottom to top in FIG. 3), as in the exemplary embodiment of FIG. 3, or may also be curved once or more in a convex and/or concave manner. Here, there are also large degrees of freedom with regard to the design of the actuation element 14.

In the region of the detection portion 20 a number of recesses or pockets 32 (see FIG. 4) are formed in the housing 30 along the lateral surface of the detection portion 20, i.e. substantially annularly. An electrically conductive sensor element 34 is arranged in each of these recesses 32. The sensor elements 34 by way of example are plate-shaped elements made of metal. The plurality of sensor elements 34 are thus arranged in the housing 30 likewise along the lateral surface of the detection portion 20 and spaced apart from one another (and thus electrically insulated from one another).

In the case of a substantially circular cylindrical detection portion 20 the plurality of sensor elements 34 are arranged substantially along a circular ring. In other exemplary embodiments with differently configured detection portions 20, the arrangement of the sensor elements 34 is adapted accordingly.

In the present exemplary embodiment the recesses 32 and the sensor elements 34 are additionally curved along the lateral surface of the detection portion 20. In other exemplary embodiments substantially planar sensor elements 34 may also be used. In such cases the, for example geometric, centers of gravity of the cross-sectional shapes are then arranged over a ring along the lateral surface of the detection portion.

By way of example, eight sensor elements 34 are also provided fully circumferentially along the entire lateral surface of the detection portion 20 in the present exemplary embodiment (FIG. 4). In other exemplary embodiments, however, different numbers (for example four, six, twelve, sixteen, etc.) of sensor elements 34 may also be provided. The sensor elements 34 may also be arranged in other exemplary embodiments only along part (for example approximately 300°, 240°, 210°, 180°, etc.) of the lateral surface of the detection portion 20. In the last-mentioned case, the recesses 32 also may be formed either only along part of the lateral surface, or may be formed along the entire lateral surface, but only occupied in part.

The electrically conductive sensor elements 34 are each electrically conductively in contact with a contact face 40 on the printed circuit board 16. As illustrated in FIG. 5, the contact faces 40 on the printed circuit board 16 are arranged substantially along a circular ring. The arrangement, design and size of the contact faces 40 are coordinated here with the sensor elements 34 and accordingly may also be formed differently in other exemplary embodiments.

In the present exemplary embodiment the contact faces 40 are provided on the side of the printed circuit board 16 facing toward the housing 30, and the sensor elements 34 may contact these contact faces 40 directly.

As indicated in FIG. 3, the sensor elements 34 are preferably each provided with at least one detent portion 36. With these detent portions 36 the sensor elements 34 can latch into the recesses 32 of the housing 30 and can be held therein. The assembly of the actuation element 14 can be simplified in this way.

In addition, the sensor elements 34 are preferably each formed at their end region facing toward the printed circuit board 16 with a resilient contact portion 38. For example, the sensor elements 34 are each slightly curved at their end facing toward the printed circuit board 16 and are therefore prestressed against the printed circuit board 16 or the contact faces 40 on the printed circuit board 16 in the assembled state of the actuation element 14. For example, it is possible in this way to compensate for production and mounting tolerances, and secure electrical contact between the sensor elements 34 and the associated contact faces 40 can be ensured permanently.

The detent portions 36 and the resilient contact portions 38 are preferably formed integrally on the sensor elements 34.

On the end face of the housing 30 facing toward the user, the housing additionally has a cover 22. The cover 22 is likewise manufactured from an electrically non-conductive plastics material. In addition, the cover 22 is at least partially permeable to light or transparent. The cover 22 is fixedly connected to the detection portion 20 (for example adhesively bonded) or is formed integrally with the rest of the housing 30 (for example by 2-component injection molding). Alternatively, the cover 22 may be clipped onto the detection portion 20.

The cover 22 in this exemplary embodiment is hood-shaped, i.e. is curved convexly in the direction of the user. In other exemplary embodiments the cover may also be curved concavely, may be curved a number of times, may be substantially planar, etc.

An indicating element 24 in the form of a display (for example LED or LCD technology) is arranged in the housing 30 behind the cover 22, i.e. on the inner side of the cover facing away from the user.

As indicated in FIG. 3, the display 24 has a fastening device 42, by which the display can be mounted on a retaining device 44 in the housing 44, for example by latching. The housing 30 or the retaining device 44 additionally has a substantially central aperture 46 (see FIG. 4), through which a connection line (not illustrated) can be guided to the display 24. In line with the aperture 46, the printed circuit board 16 also has an aperture 48 (see FIG. 5), such that the connection line can be guided to the side of the printed circuit board 16 facing away from the housing 30 and can be connected there.

Besides the display 24, further indicating elements for example in the form of optical waveguides, which are coupled with light-emitting diodes (or light-emitting diode groups) on the printed circuit board 16, may optionally be provided behind the transparent cover 22.

Figure 6:
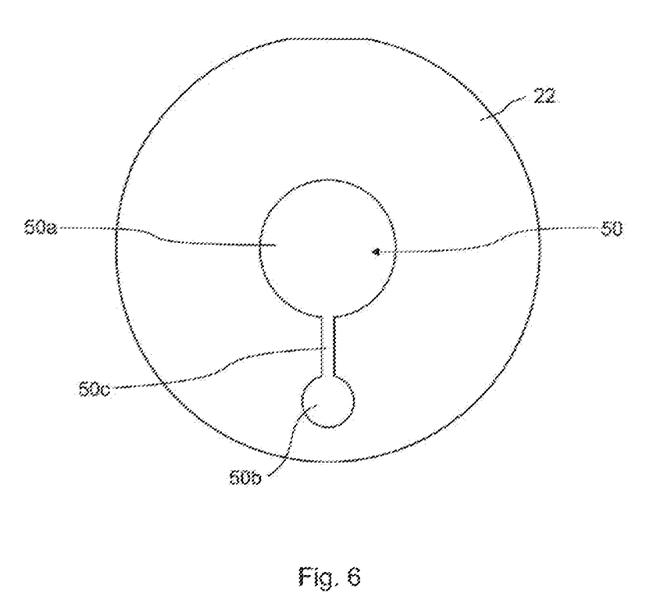
FIG. 6 is a plan view from an inner side facing away from the user of the cover of the actuation element from FIGS. 2 to 4 in accordance with an exemplary embodiment of the invention.

As illustrated in FIG. 6, a further electrically conductive sensor element 50 is provided on the inner side of the cover 22 facing away from the user. The further sensor element 50 is applied for example as a coating or an imprint on the cover 22. Here, the further sensor element 50 is permeable to light (for example in the form of halftone printing), such that the display 24 remains visible to the user through the cover 22. In other exemplary embodiments a plate-shaped further sensor element 50 with or without distance from the cover 22 may also be used.

The further sensor element 50 forms the above-mentioned second capacitive detection region of the actuation element 14. It has a substantially central, for example circular or square, sensor face 50a, an eccentric contact face 50b, and a connection face 50c between the sensor face 50a and contact face 50b, as illustrated by way of example in FIG. 6.

The contact face 50b of the further sensor element 50 is electrically conductively connected via an electrically conductive contact element 52 to a further contact face 56 on the printed circuit board 16 (see FIGS. 3 and 5). The contact element 52 is formed by way of example as a metal spring in order to permanently ensure secure electrically conductive contact to the further contact face 56. The contact element 52 is additionally arranged and thus guided in a further recess or pocket 54 in the housing 30.

In order to provide permanently secure electrically conductive contact between the contact face 50b of the further sensor element 50 and the contact element 52, a further electrically conductive resilient contact element 58 is additionally provided. This further contact element 58 sits between the contact face 50b of the further sensor element 50 and the contact element 52 in the housing 30 and is formed for example as an electrically conductive foam body. In other exemplary embodiments the contact element 52 and the further contact element 58 may also be formed integrally with one another or as one component.

The actuation element 14 additionally has a control device or is connected to a control device. The control device is arranged on the printed circuit board 16 of the actuation element 14 or is removed therefrom.

The control device preferably contains a microcontroller and is formed in such a way that it is connected to the (further) contact faces 40, 56 of the printed circuit board 16 in order to thus detect the capacitance values or capacitance value changes at the (further) sensor elements 34, 50. Here, the measurement signal is tapped substantially in parallel or sequentially.

Here, the control device is formed for example in such a way that it can detect an angle of rotation and/or a direction of rotation of a rotary movement of a user around the detection portion 20 of the actuation element 14.

The operating principle of a touch and/or proximity-sensitive capacitive push switch is known in principle to a person skilled in the art. The "virtual" rotary knob 14 of the invention is composed, as described above, from a plurality of such touch and/or proximity-sensitive push switches, which are formed along the lateral surface of the substantially cylindrical detection portion. Due to a detection and evaluation of the changes over time of the capacitance values of a plurality of these push switches, preferably of all these push switches, both a measure and a direction of a movement can be determined over a number of push switches, in the present case therefore the angle of rotation and/or direction of rotation of the rotary movement of the user.

The control device for this purpose for example has a microcontroller or processor and a memory or state register.

The control device furthermore is also connected to the display 24 via the connection line. Here, the control device is formed such that the display 24 can be controlled depending on an actuation of the actuation element 14 in its two touch and/or proximity-sensitive detection regions. By way of example, the information indicated in the display 24 is changed accordingly following an actuation of the first or second detection region of the actuation element 14.

The following is a summary list of reference numerals and the corresponding structure used in the above description of the invention:

10 operator control panel
12 opening for drawer
14 actuation element/rotary knob
16 printed circuit board
18 fastening portion/flange
20 detection portion
22 (end-face) cover
24 indicating element/display
26 aperture in 16
28 detent element on 18
30 housing
32 recess for 34
34 electrically conductive sensor element
36 detent portion of 34
38 (resilient) contact portion of 34
40 contact face on 16
42 fastening element on 24
44 retaining device/display mount
46 aperture in 44
48 aperture in 16
50 further electrically conductive sensor element
50a sensor face
50b contact face
50c connection face
52 electrically conductive contact element
54 recess for 52
56 further contact face on 16
58 further electrically conductive (resilient) contact element

The invention claimed is:

1. A touch and/or proximity-sensitive actuation element, comprising:
an electrically non-conductive housing having a fastening portion for a stationary and non-rotational mounting of the actuation element and a substantially cylindrical detection portion defining a first touch and/or proximity-sensitive detection region of the actuation element, at which a rotary movement of a user around the actuation element can be detected, said electrically non-conductive housing having an end-face cover facing toward the user, said end-face cover being at least partially permeable to light, said electrically non-conductive housing further having an electrically non-conductive cover facing toward the user for defining a second touch and/or proximity-sensitive detection region of the actuation element, in which a touch or approach of the user can be detected;
at least one indicating element disposed in said electrically non-conductive housing;
a plurality of electrically conductive sensor elements disposed in said electrically conductive housing spaced apart from one another along a lateral surface of said first touch and/or proximity-sensitive detection region;

at least one further electrically conductive sensor element disposed in said electrically non-conductive housing on a side of said electrically non-conductive cover facing away from the user;

a printed circuit board having a plurality of contact faces which are each electrically conductively in contact with one of said plurality of electrically conductive sensor elements, said printed circuit board having at least one further contact face being electrically conductively in contact with said at least one further electrically conductive sensor element.

2. The actuation element according to claim 1, wherein said electrically non-conductive housing is fastened to said printed circuit board in a non-rotational manner, and said plurality of contact faces are disposed on said printed circuit board substantially along a ring and each electrically conductively contact one of said plurality of electrically conductive sensor elements in said electrically non-conductive housing.

3. The actuation element according to claim 1, wherein said plurality of electrically conductive sensor elements each have, on a side facing toward said printed circuit board, a resilient contact portion for electrically conductively contacting one of said plurality of contact faces of said printed circuit board.

4. The actuation element according to claim 1, wherein:
said at least one indicating element has at least one fastening device; and
said electrically non-conductive housing has at least one retaining device for engagement with said at least one fastening device.

5. The actuation element according to claim 4,
further comprising a connection line; and
wherein at least one of said electrically non-conductive housing or said retaining device thereof has at least one aperture formed therein for guiding through said connection line connected to said at least one indicating element.

6. The actuation element according to claim 1, wherein said at least one further electrically conductive sensor element has an electrically conductive coating or a printing of said electrically non-conductive cover.

7. The actuation element according to claim 1, further comprising at least one electrically conductive contact element disposed in said electrically non-conductive housing and electrically conductively connects said at least one further electrically conductive sensor element to said at least one further contact face of said printed circuit board.

8. The actuation element according to claim 7, wherein said at least one electrically conductive contact element is disposed resiliently in said electrically non-conductive housing and/or is formed at least partially resiliently.

9. The actuation element according to claim 1, wherein said at least one further electrically conductive sensor element is at least partially permeable to light.

10. The actuation element according to claim 1, wherein the actuation element is used in an electronic domestic appliance.

11. An electronic domestic appliance, comprising:
an operator control panel; and
at least one touch and/or proximity-sensitive actuation element according to claim 1.

* * * * *